US012320026B2

(12) United States Patent
Twardy et al.

(10) Patent No.: US 12,320,026 B2
(45) Date of Patent: Jun. 3, 2025

(54) METHOD FOR PRODUCING COATING WITH COLORED SURFACE

(71) Applicant: Oerlikon Surface Solutions AG, Pfäffikon, Pfäffikon (CH)

(72) Inventors: Sven Matthias Twardy, Mainz (DE); Jens Eggemann, Bad Kreuznach (DE); Erik Albert, Ingelheim (DE); Christian Becker, Bingen (DE); Denis Kurapov, Walenstadt (CH)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 0 days.

(21) Appl. No.: 16/647,689

(22) PCT Filed: Sep. 17, 2018

(86) PCT No.: PCT/EP2018/075057
§ 371 (c)(1),
(2) Date: Mar. 16, 2020

(87) PCT Pub. No.: WO2019/053254
PCT Pub. Date: Mar. 21, 2019

(65) Prior Publication Data
US 2020/0277707 A1 Sep. 3, 2020

(30) Foreign Application Priority Data
Sep. 15, 2017 (CH) ........................ 1151/17

(51) Int. Cl.
*C25D 11/14* (2006.01)
*C23C 14/32* (2006.01)
(Continued)

(52) U.S. Cl.
CPC ............ *C25D 11/14* (2013.01); *C23C 14/325* (2013.01); *C23C 14/35* (2013.01);
(Continued)

(58) Field of Classification Search
CPC .......... C25D 11/14; C25D 11/06; C25D 11/26; C25D 11/04; C23C 14/325; C23C 14/35;
(Continued)

(56) References Cited

U.S. PATENT DOCUMENTS 3,909,370 A * 9/1975 Videm .................. C25D 11/26
205/322
4,188,270 A * 2/1980 Kataoka ................ C25D 11/06
205/175
(Continued)

FOREIGN PATENT DOCUMENTS

CN 107075692 A 8/2017
DE 102013102746 A1 * 9/2014 ......... C23C 14/0015
(Continued)

OTHER PUBLICATIONS

Alex Ivan Kociubczyk et al. "TiO2 Coatings in Alkaline Electrolytes Using Anodic Oxidation Technique" Procedia Materials Science, 2015, p. 65-72, vol. 8, Elsevier (Year: 2015).*
(Continued)

*Primary Examiner* — James Lin
*Assistant Examiner* — Patrick S Ott

(57) ABSTRACT

The present invention relates to a method for producing coated substrate bodies, wherein a plurality of substrate bodies comprising surfaces to be coated are provided with a colored coating surface, the method comprising following steps:
providing the substrate bodies to be coated in the interior of a vacuum coating chamber,
depositing a coating on a surface of the substrate bodies to be coated, the deposition of the coating involving the deposition of a metallic layer comprising at least two different metals,
forming a colored oxide layer exhibiting a colored surface by anodic oxidation of the metallic layer,
(Continued)

Figure 1:
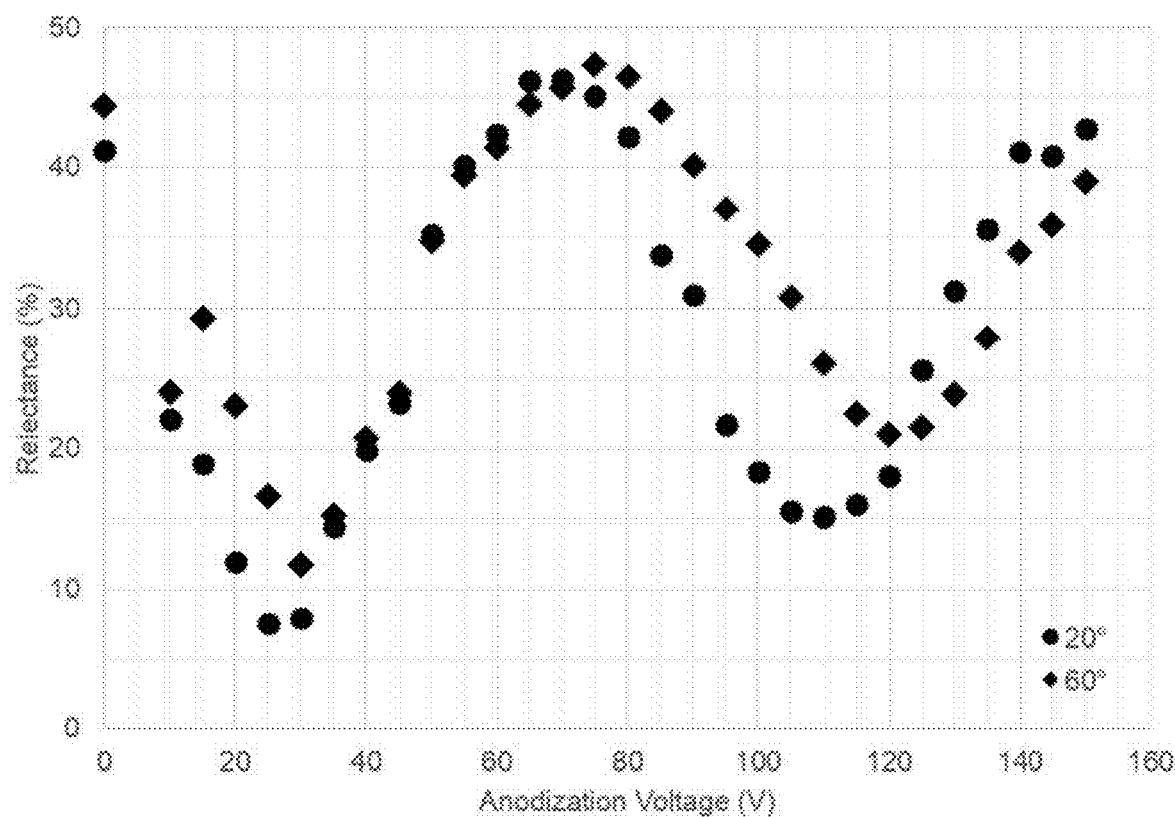

wherein:
the anodic oxidation takes place in an alkaline electrolyte bath with the coated substrate bodies connected as anodes.

6 Claims, 3 Drawing Sheets

(51) Int. Cl.
    *C23C 14/35* (2006.01)
    *C23C 14/58* (2006.01)
    *C25D 11/06* (2006.01)
    *C25D 11/26* (2006.01)

(52) U.S. Cl.
    CPC .......... *C23C 14/5853* (2013.01); *C25D 11/06* (2013.01); *C25D 11/26* (2013.01)

(58) Field of Classification Search
    CPC .............. C23C 14/5853; C23C 14/165; C23C 14/3485
    See application file for complete search history.

(56) References Cited

U.S. PATENT DOCUMENTS

| | | | | |
|---|---|---|---|---|
| 5,059,492 | A * | 10/1991 | Shindou | B05D 7/51 428/625 |
| 5,616,229 | A * | 4/1997 | Samsonov | C25D 5/18 205/107 |
| 5,711,826 | A * | 1/1998 | Nordstrom | G21C 21/02 148/519 |
| 6,758,956 | B1 * | 7/2004 | Kruse | C23C 22/60 205/107 |
| 9,464,354 | B2 | 10/2016 | Hampsch et al. | |
| 2004/0247904 | A1 * | 12/2004 | Chan | C23C 14/5853 428/469 |
| 2005/0103639 | A1 * | 5/2005 | Lu | C25D 11/26 205/333 |
| 2005/0205415 | A1 * | 9/2005 | Belousov | F01D 5/005 204/192.12 |
| 2006/0019035 | A1 * | 1/2006 | Munz | C23C 14/5853 427/402 |
| 2010/0320089 | A1 * | 12/2010 | Misra | C25D 11/26 205/109 |
| 2011/0005920 | A1 * | 1/2011 | Ivanov | H01J 37/3408 204/192.13 |
| 2011/0314991 | A1 * | 12/2011 | Yamamoto | B21D 28/00 83/694 |
| 2012/0286152 | A1 * | 11/2012 | Jones | H01J 49/145 427/523 |
| 2014/0171924 | A1 * | 6/2014 | Janssen | C23C 14/0641 606/1 |
| 2015/0147678 | A1 * | 5/2015 | Kihira | C23C 22/24 429/509 |
| 2015/0167176 | A1 * | 6/2015 | Hampsch | C23C 14/5873 428/629 |
| 2016/0342242 | A1 * | 11/2016 | Hata | C22C 19/05 |

FOREIGN PATENT DOCUMENTS

| | | | | |
|---|---|---|---|---|
| GB | 2063920 | A * | 6/1981 | ............ C25D 11/14 |
| JP | S56153318 | A | 11/1981 | |
| JP | S61163262 | A | 7/1986 | |
| JP | H06287797 | A | 10/1994 | |
| JP | H0867978 | A | 3/1996 | |
| JP | 2012011393 | A | 1/2012 | |
| JP | 2013194298 | A | 9/2013 | |
| JP | 2013202700 | A | 10/2013 | |
| KR | 20040105497 | A | 12/2004 | |
| WO | WO-2013092580 | A2 * | 6/2013 | ............ C25D 11/06 |

OTHER PUBLICATIONS

DE-102013102746-A1 Translation (Year: 2014).*
WO-2013092580-A2 Translation (Year: 2013).*
Alex Ivan Kociubczyk et al. "TiO2 Coatings in Alkaline Electrolytes Using Anodic Oxidation Technique" Procedia Materials Science, Jan. 1, 2015, pp. 65-72, vol. 8, Elsevier.
Young-Taeg Sul et al. "The Electrochemical Oxide Growth Behaviour on Titanium in Acid and Alkaline Electrolytes" Medical Engineering & Physics, Jun. 26, 2001, pp. 329-346 (abstract), vol. 23, issue 5, Elsevier.
Burleigh T. D. et al: "Anodizing Steel in KOH and NaOH Solutions", Journal of The Electrochemical Society, vol. 154, No. 10, Jan. 1, 2007 (Jan. 1, 2007), p. C579, XP055851723, ISSN: 0013-4651, DOI: 10.1149/1.2767417 Retrieved from the Internet: URL:https://citeseerx.ist.psu.edu/viewdoc/download? doi=10.1.1.879.4979&rep=rep1 &type=pdf.
Hovsepian P. E. et al: "High Performance Colorful PVD Coatings", AVS 47th Annual Technical Conference, Apr. 24, 2004 (Apr. 24, 2004), pp. 528-533, XP055834200.
Printout from the website of Sheffield Hallam University (https://www.shu.ac.uk/research/specialisms/materials-and-engineering-research-institute/facilities/pvd-coating-equipment), retrieved on Jul. 30, 2021.
Notice of Reasons for Refusal for Japanese Application No. 2020-514613, mailed Aug. 16, 2022; 11 pages with translation.

* cited by examiner

METHOD FOR PRODUCING COATING WITH COLORED SURFACE

The present invention relates to a reliable method for producing a coated substrate body having a coating on a surface of the substrate body, in particular the substrate body can be a tool, wherein the coating comprises a colored top layer. The method according to the present invention may allow producing colored top layers exhibiting high specular reflection gloss and reproducible surface quality for all coated substrate bodies.

STATE OF THE ART

Physical Vapor Deposition (PVD) coatings are currently applied for providing improved surface properties to different kind of substrate bodies, e.g. tools and components. PVD-produced hard thin coatings with thicknesses in the micrometer range are usually applied on surfaces of tools and components for attaining improved performance during operation in different kind of applications, e.g. chip removal, metal forming, sliding, etc.

It is also known that coatings can be used for decorative or indicative purposes. In the patent document U.S. Pat. No. 9,464,354 B2 it is suggested the use of single-layer wear-recognition layer or a multilayer wear-recognition layer. The wear-recognition layer or multilayer being produced by depositing elemental metals, metal alloys or electrically conductive metal compounds with a PVD process and comprising a region produced by anodic oxidation in an acid electrolyte bath. The region produced by anodic oxidation does not extend over the entire thickness of the wear-recognition layer or multilayer.

Standard methods for anodic oxidation includes as first step a pickling step (in case of bulk materials), followed by an anodic oxidation step with an acidic electrolyte.

In the case mentioned above, in which metallic layers are deposited by using PVD techniques and the metallic layers are anodic oxidized for obtaining a colored surface, the pickling step is not possible because the metallic layers are very thin. However, the anodic oxidation step is used.

Problem to be Solved

The inventors have found that colored surfaces obtained by anodic oxidation of metallic thin layers (with thickness in the micrometer range) in an acid electrolyte bath show frequently bad surface quality, in particular not well-defined color, not glossy visual effect and corroded surface appearance. It happens because of damages (sometimes even including dissolution) that the metallic layer and sometimes also the surface of the substrate body or any coating layer placed below the metallic layer suffers during anodic oxidation with an acid electrolyte. Therefore, anodization of such kind of metallic layers with an acidic electrolyte would not work well enough to be used as established process for producing colored surfaces exhibiting high quality and high level of specular refection gloss.

This method is also not flexible enough for facilitating production of a high variety of good differenced colored coatings, which exhibit high specular reflection gloss, and which can be used for purposes of identification of coated products belonging to a determined line of products to be used in a particular application, e.g. for identifying a determined line of coated tools suitable for machining of Inconel 718.

Objective of the Present Invention

A main objective of the present invention is to provide a reliable method for producing a variety of coated substrate bodies, in particular coated tools, wherein the coating can be produced exhibiting a different colored surface with high specular reflection gloss, which allows visual or optical differentiation of the coated substrate bodies produced in this manner.

The method according to the present invention should allow coating of a substrate body, preferably of a plurality of substrate bodies comprising metallic and/or ceramic surfaces to be coated, in particular tools comprising a metallic and/or ceramic surface to be coated.

Furthermore, the method according to the present invention should allow reproducible results, in particular regarding surface quality and optical properties of the coating of the coated substrate bodies.

DESCRIPTION OF THE PRESENT INVENTION

The objective of the present invention may be attained by providing a method for producing coated substrate bodies, wherein a plurality of substrate bodies comprising surfaces to be coated are provided with a colored coating surface, the method comprising following steps:
  providing the substrate bodies to be coated in the interior of a vacuum coating chamber,
  depositing a coating on a surface of the substrate bodies to be coated, wherein the deposition of the coating comprises at least the deposition of a metallic layer comprising one or more metals, preferably two or more metals, or comprising one or more metal alloys formed of at least two different metals,
  forming a colored oxide layer exhibiting a colored surface by anodic oxidation of the metallic layer,
  wherein:
  the anodic oxidation takes place in an alkaline electrolyte bath with the coated substrate bodies connected as anodes.

In the context of the present invention the term "colored oxide layer" refers in particular to a transparent or semi-transparent oxide layer exhibiting a color impression caused by interference effect. In other words, coloring by interference effect is the mechanism used for giving a color impression to transparent or semitransparent oxide layers which are being called colored oxide layers in the context of the present invention.

In the context of the present invention, the term "substrate body" is used for referring to any kinds of component or pieces having a surface that can be coated.

In order to provide the substrate bodies with a colored coating surface according to the present invention, the colored oxide layer should be preferably formed as outermost layer of the coating.

By using an alkaline electrolyte bath instead of an acid electrolyte bath, surprisingly outperformed results concerning variety of well-defined and reproducible colors with high specular reflection gloss were attained.

The method according to the present invention may enable attaining better results by anodizing PVD coatings and in this manner by coloring up coated surfaces of different kind of substrate bodies.

Level of specular reflection gloss as well as reflectance (shown in FIGS. 1 and 2) was performed with a measuring device of the type "MICRO-TRI-GLOSS" (BYK-Gardner GmbH, Germany) and according to DIN EN ISO 2813: 2015-02.

According to a preferred embodiment of the present invention, the metallic layer is deposited as a metallic single layer comprising one or more metals, preferably two or more metals.

The one or more metals can be present in the metallic layer as one or more elemental metals or as one or more alloys or as a combination of one or more elemental metals and one or more alloys.

If the metallic layer comprises one or more elemental metals and one or more alloys, one or more metals can be present in the metallic layer in the form of elemental metal and in the form of a component of an alloy at the same time.

The voltages required for the anodic oxidation when producing the colored oxide layer according to the present invention can vary.

According to a preferred embodiment of the present invention the anodization voltage used for producing the colored oxide layer by anodic oxidation is lower than 200 V.

Particularly good results were obtained by applying an anodization voltage of 150 V or lower.

FIG. 1 shows the influence of the applied anodization voltage in the percentage of reflectance of the colored surfaces obtained by anodic oxidation of a metallic layer consisting of an AlTi-alloy that was produced by HiPIMS from AlTi alloy targets in argon atmosphere. The anodic oxidation at the different anodization voltages was carried out in each case in an aqueous sodium hydroxide solution with NaOH concentration of 0.6% in weight percentage, according to the present invention. Different colors with different percentages of reflectance were produced. As it can be observed, the reflectance was measured at an angle of 20° and also at an angle of 60°. The measured values varied between approximately 7.5% and approximately 47.5% depending on the applied voltage. The colors obtained could be adjusted by adjusting the anodization voltages.

Figure 2:
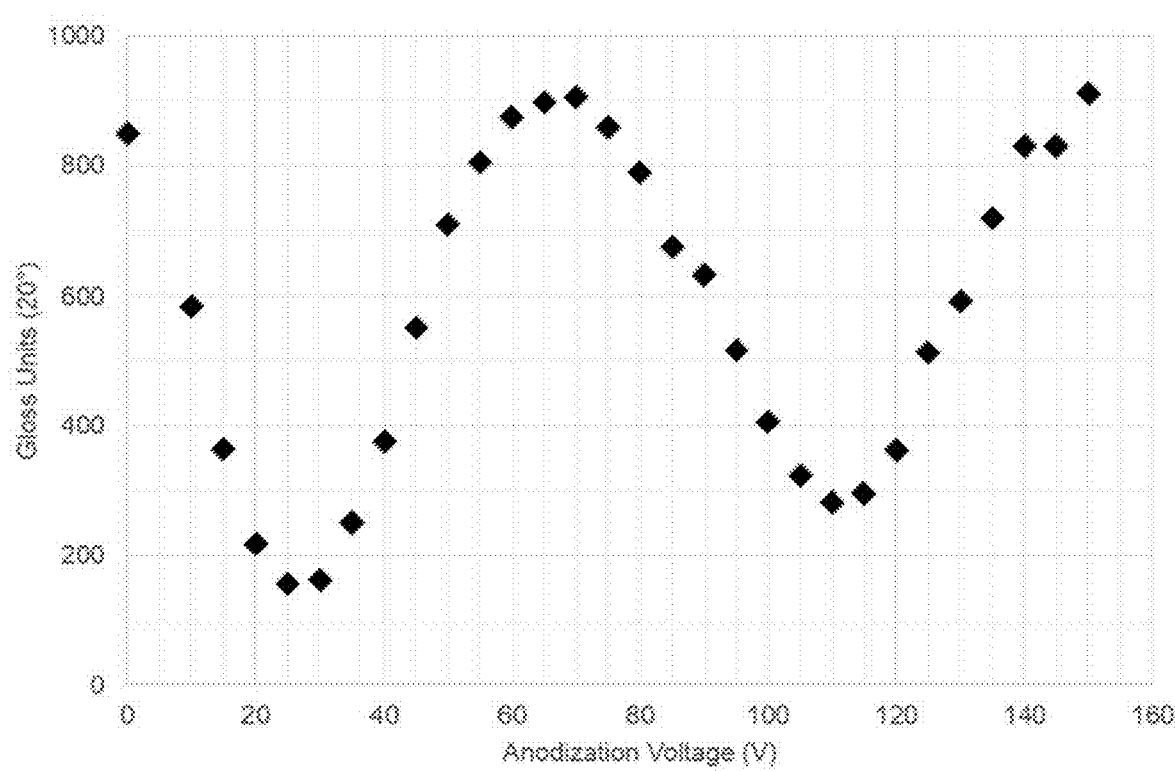

FIG. 2 shows the curve of the influence of the applied anodization voltage in the specular reflection gloss level of the colored surfaces that were also measured for constructing the FIG. 1, but in FIG. 2, only the levels of specular reflection gloss measured at an angle of 20° are shown.

The inventors determined that especially surprisingly well-defined colors and high specular reflection gloss can be attained according to the present invention, when the pH value of the alkaline electrolyte bath used for anodic oxidation of the metallic layer is in a range between 12 and 14, more preferably between 12.5 and 13.5.

The above-mentioned pH can be attained by using any base, for example potassium hydroxide and/or sodium hydroxide.

According to a preferred embodiment of the present invention, the alkaline electrolyte bath comprises sodium hydroxide (NaOH).

The inventors determined that especially good results can be obtained by using an aqueous alkaline electrolyte bath consisting of an aqueous sodium hydroxide solution i.e. $H_2O+NaOH$.

In the case of using aqueous sodium hydroxide solution as alkaline electrolyte bath for forming the colored oxide layers according to the above-mentioned embodiment of the present invention, especially reproducible good results were obtained, when the NaOH concentration in weight percentage was in a range between 0.5 and 0.6%.

In the case of using an NaOH concentration in weight percentage of 0.6%, a pH value of approximately 13+/−0.2 was measured, which correlates very good with the pH-value that can be calculate theoretically, which is 13.18. Accurate measurement of high pH value is difficult due to phenomena known as alkali error.

According to the present invention the metallic layer is deposited having a thickness, which enable anodic anodization at a desired anodization voltage, wherein the anodic oxidation can be effected from the outer surface of the metallic layer to a depth of penetration that is not larger than the total thickness of the metallic layer.

According to a preferred embodiment of the present invention the metallic layer is deposited having a thickness, which enable anodic anodization at a desired anodization voltage, wherein the anodic oxidation can be effected from the outer surface of the metallic layer to a depth of penetration that is as equal as possible to the total thickness of the metallic layer.

Depending on the color of the colored oxide layer that is intended to be achieved, then the metallic layer can be deposited having a preferred element composition, for example being formed of titanium, preferably formed of a mixture of aluminum and titanium or a mixture of titanium and silicon or a mixture of aluminum and silicon.

According to a preferred embodiment of the present invention the metallic layer comprises titanium (Ti) or a mixture of aluminum and titanium (AlTi) or an AlTi alloy, or the metallic layer is made of Ti or of AlTi or of an AlTi alloy.

According to one further preferred embodiment of the present invention the metallic layer comprises a mixture of titanium and silicon (TiSi) or an TiSi alloy, or the metallic layer is made of TiSi or of an TiSi alloy.

However, also other metals and mixtures of metals or metal alloys can be used for forming different colors.

According to one further preferred embodiment of the present invention the metallic layer comprises or is formed of:
  a mixture of aluminum and chromium, or
  zirconium or a mixture of metals comprising zirconium, or
  niobium or a mixture of metals comprising niobium, or
  tantalum or a mixture of metals comprising tantalum, or
  chromium or a mixture of metals comprising chromium.

All above-mentioned combinations or mixtures of metals are particularly suitable for attaining a broad spectrum of well-defined colors (the term "well-defined color" is used in this context to referring to a color impression of a colored surface being optically identifiable and in particular having homogeneous optical properties related to identification or definition of colors with can be measured with well-known optical methods).

Figure 3:
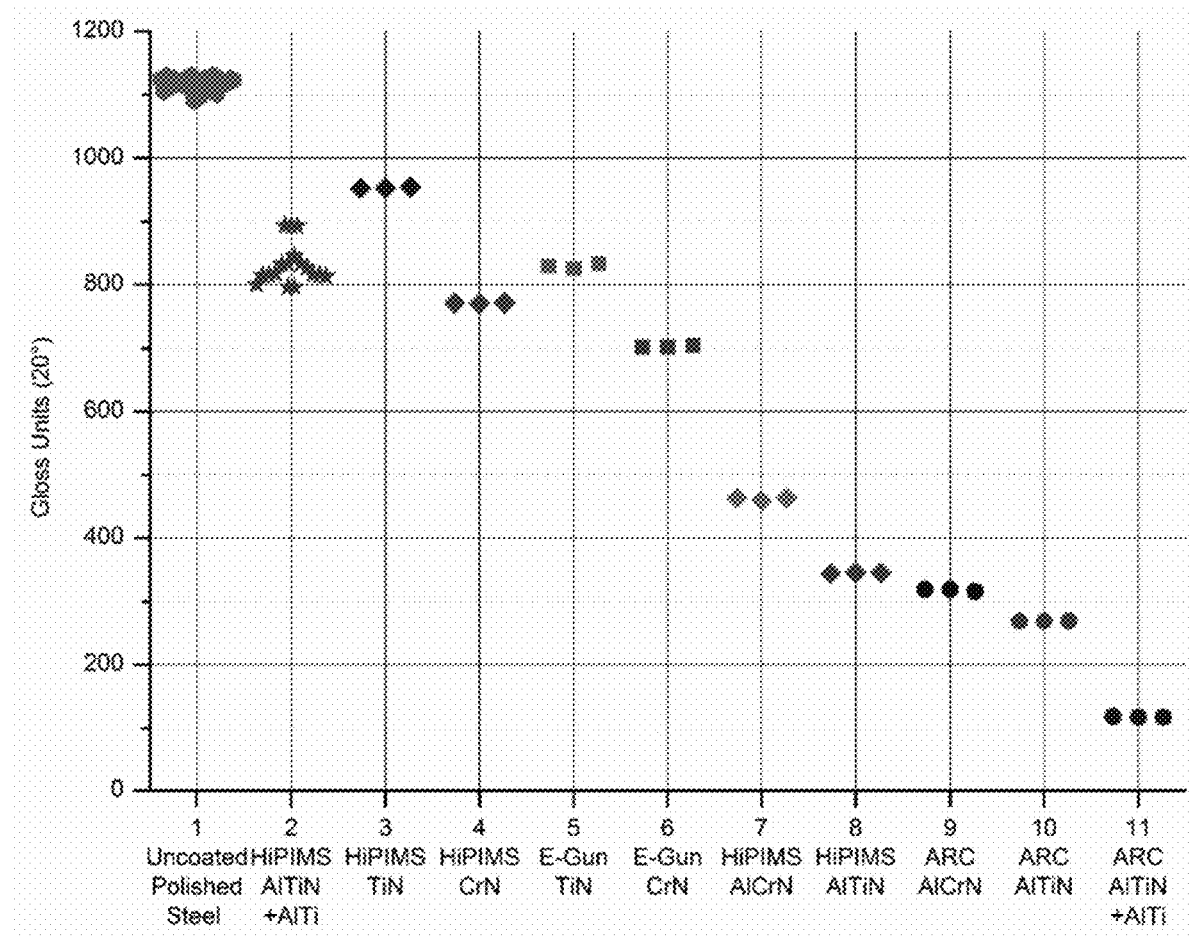

FIG. 3 shows the different levels of specular reflection gloss measured at an angle of 20° on different kinds of surfaces. Example 2 in FIG. 3 corresponds to a coated substrate body with a coating comprising a functional layer formed of aluminum titanium nitride (AlTiN) and a metallic layer formed of aluminum titanium alloy (AlTi-alloy) which has still not been anodic oxidized. Both the functional layer and the metallic layer were deposited by using HiPIMS techniques from the same AlTi alloy targets and by using same coating conditions, excepting that during deposition of the functional layer nitrogen gas flow and argon gas flow were introduced in the coating chamber, while during deposition of the metallic layer only argon gas flow was introduced in the coating chamber. Example 11 in FIG. 3 corresponds to a coated substrate body with a coating comprising a functional layer formed of aluminum titanium nitride (AlTiN) and a metallic layer formed of aluminum titanium alloy (AlTi-alloy) which has still not been anodic oxidized. Both the functional layer and the metallic layer were deposited by using arc ion plating techniques (arc vaporization) without any micro-particles filter (micro-particles in this context are also called droplets) system from the same AlTi alloy targets and by using same coating conditions, excepting that during deposition of the functional layer nitrogen gas flow was introduced in the coating chamber, while during deposition of the metallic layer no gas flow was introduced in the coating chamber.

In FIG. 3 it can be observed that the specular reflection gloss measured in Gloss Units (GU) at an angle of 20° is more higher in coatings (including metallic layer as top layer before anodic oxidation) deposited by using HiPIMS techniques than in coatings (also including metallic layer as top layer before anodic oxidation) deposited by using arc ion plating techniques without any micro-particles filter system.

It is important to note that the quality of the surface of the metallic layer will be influenced by the quality of the surface on which the metallic layer is being deposited, especially when the metallic layer is deposited as a thin layer having thickness in the micrometer range, for example a layer thickness between 1 and 2 micrometers.

Comparing gloss level values of example 2 (HiPIMS deposited AlTiN+AlTi coating) with gloss level values of example 1 (uncoated polished steel substrate surface) as reported in FIG. 3, it is possible to observe that the values measured by the HiPIMS deposited coating are very close to the values measured by the uncoated surface.

It was also observed that the higher level of specular reflection gloss of the surface of the metallic layer the higher level of specular reflection gloss of the surface of the colored oxide layer formed by anodic oxidation according to the present invention.

Within the framework of the present invention it was possible to provide cutting tools with coatings comprising outermost layers formed as colored oxide layers having different colors. This color effect was attained due to the interference colors that have resulted from the thin oxide layers that were produced according to the present invention by anodic oxidation in alkaline electrolyte baths of previously PVD coated surfaces of the cutting tools.

According to a preferred embodiment of the present invention, the metallic layer is deposited by using any PVD technique, e.g. arc vaporization or magnetron sputtering or electron beam, or any other, or any variant of them, preferably PVD techniques which allow depositing smooth coatings.

The inventors have determined that not only high quality (in particular regarding low roughness for exhibiting smooth surface) of the metallic layer to be anodic oxidized is an important factor for process stability and functionality but very surprisingly the combination of the alkaline electrolyte and high quality of the metallic layer to be anodic oxidized in the alkaline electrolyte bath, in particular when the metallic layer to be anodic oxidized exhibits high quality in terms of high density and high smoothness, the combination results in an unexpected very significant effect in the quality of the resulted colored surface of the colored oxide layer, in particular results in unexpected very well defined color and unexpected high specular reflection gloss.

It was found that the specular reflection gloss of the colored surfaces obtained after anodic oxidation in an alkaline electrolyte bath according to the present invention correlates with the surface quality of the previously deposited metallic layers.

The inventors have investigated the use of different magnetron sputtering processes for the deposition of the metallic layer to be oxidized according to the present invention and found that this kind of PVD processes are particularly advantageous because the metallic layers deposited in this manner showed higher smoothness. The inventors conclude that the smoother surface of the metallic layer the higher specular refection gloss of the colored oxide layer produced by anodic oxidation of the metallic layer according to the present invention. In other words, the lower droplets and defects at the metallic layer the more glossy colored surfaces can be produced (in the context of the present invention the term "more glossy" or "glossier" is to be understood also as more shiny). The inventors have also investigated the particular variant of magnetron sputtering referred to as High power impulse magnetron sputtering (HiPIMS), which is also called High Power Pulse Magnetron Sputtering (HPPMS). This kind of magnetron sputtering is characterized by applying high power densities to the target material being sputtered, attaining in this manner very high ionization of the sputtered material and resulting in the deposition of coating with higher density than conventional magnetron sputtering processes, in which the attained ionization is considerably lower. The colored oxide layers produced by anodic oxidation of metallic layers deposited by using HiPIMS processes exhibited higher specular reflection gloss and well-defined color than when the metallic layers were produced by using non-filtered arc vaporization processes. The inventors conclude that the higher density and smoother surface of the metallic layer the higher specular refection gloss of the colored oxide layer produced by anodic oxidation of the metallic layer according to the present invention. The inventors think that similar very good results like the obtained by using HiPIMS for depositing the metallic layer, could be also attained by using other kind of PVD techniques which can allow deposition of metallic layers exhibiting high density and very smooth surface, e.g. by filtered arc vaporization techniques, which allow filtering of micro-particles (such as the so-called droplets).

According to a preferred embodiment of the present invention, the metallic layer is deposited by means of a PVD process, in which HiPIMS techniques are used.

According to a further preferred embodiment of the present invention, the metallic layer is deposited by means of a PVD process, in which conventional magnetron techniques or filtered arc vaporization techniques are used.

Valve metals (Al, Ti, Ta, Nb, V, Hf, W) are classified as valve metals because their surface is immediately covered with a native oxide film of a few nanometers when these metals are exposed to oxygen containing surroundings. Therefore, the inventors consider these metals are especially suitable for anodic oxidation in the context of the present invention.

These valve metals as well as Cr and Zr were used for forming metallic layers for different experiments in the context of the present invention.

As already mentioned above, exceptional brilliant finishing of the colored coating surfaces resulted from the anodic oxidation in alkaline electrolyte baths were attained, when the metallic layer that was oxidized was deposited by using HiPIMS techniques.

It is generally understood that hard films deposited by using physical vapour deposition (PVD) methods exhibit compressive residual stress, which normally results in improved performance of cutting tools, for example regarding chipping resistance.

Among various PVD processes, arc vaporization (usually and hereafter also called arc ion plating) is a widely employed PVD technique owing to its high ionization rate of the components of the material vaporized from the target, as well as the high adhesiveness of the hard films that can be obtained.

It is, however, not easy to obtain the hard film without micro-particles (currently referred as to droplets), when arc ion plating processes are carried out without using additional equipment, e.g. a system for filtering micro-particles. During arc ion plating processes target material is melted under arc discharge, thereby molten metal can be ejected from the target surface and incorporated into the growing hard film forming the droplets.

The droplets amount increases significantly if the arc discharge is operated without presence of reactive gas (reactive gases are for example nitrogen and oxygen), which is the case when metallic layers are to be deposited.

Since in magnetron sputtering processes no melting of target material is intended, the amount of droplets in coatings produced by magnetron sputtering is very low in comparison with coatings produced by arc ion plating.

Particular high coating density can be attained by using HiPIMS processes in which electric power is successively applied to more than one target and the targets are sequentially operated one after each other, in such a manner that electric power is applied to both a target coming to the end of being energized and the next target going to be energized.

By employing such sputtering technique for the coating, the ionization rate of target material is kept at a high level during the coating, and thereby the hard film will have a higher density and crystallinity.

With the intention of forming coatings exhibiting high coating density and crystallinity, the maximum power density of pulsed power should be controlled to be preferably maintained at a value of $1.0 \text{ kW/cm}^2$ or at a higher value. An excessively large power density is also not desired, because it could result in formation of unstable coatings.

Therefore, the maximum power density of the applied pulsed power during coating should be maintained at a valued of $3.0 \text{ kW/cm}^2$ or at a lower value. If the duration of the time during which the electric power is applied to both the target coming to the end of being energized and the next target going to be energized is too short or too long, the targets will not be sufficiently ionized and consequently the density of the coating being formed will not be so high.

On these grounds the above-mentioned duration time should be preferably adjusted to be 5 microseconds or longer but also preferably 20 microseconds or shorter, hence it is recommendable to select the mentioned duration time being not shorter than 5 microseconds and not longer than 20 microseconds.

Particularly high ionization rates of target material and hence particularly high coating density can be attained by using at least 3 targets operated as described above.

Metallic layers exhibiting particularly high coating density were produced from TiAl-based alloy targets.

The metallic layers produced by HiPIMS according to the present invention are preferably produced by using argon as work gas.

According to one preferred embodiment of the present invention the colored coating can be provided on a surface of the substrate body in the following manner:
  depositing a functional layer directly on the surface of the substrate body, the functional layer being produced as nitride of the same metals that will be comprised in the metallic layer,
  depositing the metallic layer,
  producing a colored layer by anodic oxidation of the metallic layer in an alkaline electrolyte bath.
wherein the same targets and the same PVD technique are used for producing the functional layer and the metallic layer (e.g. HiPIMS as described above or filtered arc ion plating) and in the case of using HiPIMS then using argon as work gas and nitrogen as reactive gas for the deposition of the functional layer, and using only argon as work gas for the deposition of the metallic layer.

By using the same target composition for depositing the functional layer and the metallic layer, it would be possible for example to deposit a TiAlN layer as functional layer and a TiAl layer as metallic layer.

Of course, it is also possible to use different target compositions for the deposition of the functional layer and the metallic layer, in this manner it would be possible for example to deposit an AlCrN layer as functional layer and an AlTi layer as metallic layer.

Preferred functional layers in the context of the present invention are AlTiN, AlCrN, TiSiN, TiN, TiCN, TiB2. Of course, other kind of nitride, carbide, carbonitride, oxide, oxynitride or carboxynitride layers can be also used as functional layers.

If a nitride layer, as mentioned above, is deposited as functional layer, the nitride layer should be preferably a hard film exhibiting high density and NaCl-type crystal structure and having a microstructure with an increased crystallinity. For that preferably a negative bias voltage should be applied to the substrate body to be coated and to be preferably controlled in a range from −100 V to −20 V. The metallic layer can be deposited at the same coating conditions but without presence of nitrogen gas.

For successful anodic oxidation of such kind of metallic layers, it is necessary to carry out the anodic oxidation process according to the present invention, so that damages or dissolution of the thin films can be avoided.

In this regard at least following major differences in comparison with processes according to the state of the art must be introduced:

According to a preferred embodiment of the present invention the coating comprises at least one functional layer between the substrate body and the colored oxide layer (colored by interference effect). The functional layer can be for example a hard thin film (in the context of the present invention the term "a hard thin film" refers to "a hard film coating") exhibiting wear resistance and/or oxidation resistance.

Any preferred embodiment of a method according to the present invention can be advantageously used for producing colored coated substrate bodies. The coated substrate bodies can be for example:
  tools, e.g. cutting tools or forming tools,
  medical instruments or medical devices,
  automotive parts,
  decorative components
  any tools or components having SiC or SiN as substrate material to be coated.

The colors produced according to the present invention can meet both technical and decorative purposes and can be used for example as particular color coding of tools.

The Present Invention Discloses:

A method for producing coated substrate bodies, wherein one substrate body or a plurality of substrate bodies comprising one or more surfaces to be coated are provided with a colored coating surface, the method comprising following steps:

providing the substrate bodies to be coated in the interior of a vacuum coating chamber, depositing a coating on a surface of the substrate bodies to be coated, the deposition of the coating involving the deposition of a metallic layer comprising one or more metals or comprising one or more metal alloys formed of at least two different metals, forming a colored oxide layer exhibiting a colored surface by anodic oxidation of the metallic layer, wherein:

the anodic oxidation takes place in an alkaline electrolyte bath with the coated substrate bodies connected as anodes.

The pH value of the alkaline electrolyte bath used for anodic oxidation of the metallic layer should be in a range between 12 and 14, preferably in a range between 12.5 and 13.5.

Preferably the alkaline electrolyte bath comprises sodium hydroxide (NaOH).

Preferably the alkaline electrolyte bath is an aqueous sodium hydroxide solution, when using it, then the NaOH concentration in the solution is preferably not lower than 0.5 and not higher than 0.6 in weight percentage.

For attaining a high quality of the metallic layer, this layer is preferably deposited by using a PVD technique of the type:

magnetron sputtering techniques,
HiPIMS techniques, or
arc ion plating techniques including use of micro-particles filter systems.

Preferably the anodization voltage has to be selected to be lower than 200 V.

Preferred embodiments of the present invention can be summarized as following:

A method for producing coated substrate bodies having coating with a colored coating surface, the method comprising following steps:

a) providing one substrate body or a plurality of substrate bodies comprising one or more substrate surfaces to be coated in the interior of a vacuum coating chamber, b) after execution of step a), deposition of a coating on the one or more substrate surfaces to be coated, wherein the deposition of the coating involves deposition of a metallic layer, wherein if the coating being deposited comprises further layers, the metallic layer is deposited as top layer, c) after execution of step b), formation of the colored coating surface by anodic oxidation of the metallic layer, wherein:

the metallic layer is deposited as single metallic layer comprising at least two different metals and the anodic oxidation takes place in an alkaline electrolyte bath having pH value between 12 and 14, preferably between 12.5 and 13.5, wherein the one or more substrate surfaces to be coated connected as anodes and the alkaline electrolyte bath comprises sodium hydroxide (NaOH).

The directly above-mentioned method can be also executed in such a manner that during step b) at least one non-metallic layer is deposited between the one or more substrate surfaces to be coated and the single metallic layer, wherein the single metallic layer is deposited directly on the at least one non-metallic layer.

This non-metallic layer can be for example a functional layer as mentioned above.

Of course, according to the present invention it is also possible to deposit the metallic layer directly on the substrate surface to be coated without depositing any layer between substrate and metallic layer.

Any of the two directly above-mentioned methods, wherein the alkaline electrolyte bath is an aqueous sodium hydroxide solution having a NaOH concentration not lower than 0.5 and not higher than 0.6 in weight percentage.

Any of the three directly above-mentioned methods, wherein the metallic layer is deposited by using a PVD techniques which permit attaining a high quality of the metallic layer (in particular regarding low roughness and smoothness), preferably by using:

magnetron sputtering techniques,
HiPIMS techniques, or
arc ion plating techniques including use of micro-particles filter systems.

As already mentioned above the anodization voltage should be selected to be lower than 200 V.

For obtaining particular colors it can be advantageously to produce the metallic layer comprising:

one or more metals and one or more metal alloys, or
one or more metal alloys.

The invention claimed is:

1. A method for producing coated substrate bodies having a colored coating surface, the method comprising:
   a) providing one substrate body or a plurality of substrate bodies comprising one or more substrate surfaces to be coated in an interior of a vacuum coating chamber,
   b) after execution of step a), depositing a coating on the one or more substrate surfaces to be coated, wherein the deposition of the coating involves depositing at least one non-metallic layer on the one or more substrate surfaces to be coated, and depositing a single metallic layer directly on the at least one non-metallic layer as a top layer using HiPIMS techniques,
   c) after execution of step b), forming a colored oxide layer exhibiting the colored coating surface by anodic oxidation of the metallic layer, wherein the colored coating surface has homogeneous optical properties,
   wherein:
      the anodic oxidation takes place in an alkaline electrolyte bath having a pH value between 12.5 and 13.5, wherein the one or more substrate surfaces to be coated are connected as anodes and the alkaline electrolyte bath is an aqueous sodium hydroxide solution having a NaOH concentration not lower than 0.5 and not higher than 0.6 in weight percentage;
      the metallic layer consists of:
         aluminum and titanium (AlTi), or
         an AlTi alloy, or
         titanium and silicon (TiSi),
      wherein the at least one non-metallic layer is a functional layer of the type nitride, carbide, carbonitride, oxide, oxynitride or carboxynitride.

2. The method according to claim 1, wherein an anodization voltage is selected to be lower than 200 V.

3. The method according to claim 1, wherein the metallic layer is deposited having a thickness, which enables using a desired anodization voltage, wherein the metallic layer can be effected by anodic oxidation from the outer surface to a depth of penetration that is not larger than the total thickness of the metallic layer but is essentially equal to the total thickness of the metallic layer.

4. The method according to claim 1, wherein the previously deposited metallic layer has a surface quality in terms of density and smoothness that correlates with a specular reflection gloss of the colored surface obtained after anodic oxidation.

5. The method according to claim 1, wherein the functional layer is AlTiN, AlCrN, TiSiN, TiN, or TiCN.

6. The method according to claim 1, wherein the HiPIMS techniques include applying pulsed power to the metallic layer at a power density at a value between 1.0 kW/cm$^2$ and 3.0 kW/cm$^2$, with a duration time between 5 microseconds and 20 microseconds.

* * * * *